(12) United States Patent
Brigham et al.

(10) Patent No.: US 6,703,672 B1
(45) Date of Patent: Mar. 9, 2004

(54) POLYSILICON/AMORPHOUS SILICON COMPOSITE GATE ELECTRODE

(75) Inventors: Lawrence N. Brigham, Beaverton, OR (US); Chia-Hong Jan, Portland, OR (US); Binglong Zhang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 08/917,796

(22) Filed: Aug. 25, 1997

Related U.S. Application Data

(62) Division of application No. 08/536,525, filed on Sep. 29, 1995, now abandoned.

(51) Int. Cl.[7] .............................................. H01L 29/76
(52) U.S. Cl. ........................ 257/407; 257/412; 257/413
(58) Field of Search ............................... 257/407, 412, 257/413

(56) References Cited

U.S. PATENT DOCUMENTS

| | | | | |
|---|---|---|---|---|
| 4,411,734 A | | 10/1983 | Maa | ........................... 156/643 |
| 4,697,333 A | * | 10/1987 | Nakahara | ..................... 437/20 |
| 4,737,474 A | | 4/1988 | Price et al. | ................. 437/200 |
| 5,089,432 A | * | 2/1992 | Yoo | ............................ 257/413 |
| 5,121,186 A | * | 6/1992 | Wong et al. | ................ 257/412 |
| 5,147,820 A | | 9/1992 | Chittipeddi et al. | ........ 437/193 |
| 5,147,826 A | | 9/1992 | Liu et al. | ..................... 437/233 |
| 5,298,436 A | | 3/1994 | Radosevich et al. | .......... 437/29 |
| 5,326,722 A | | 7/1994 | Huang | ......................... 437/186 |
| 5,389,570 A | | 2/1995 | Shiozawa | .................... 437/101 |
| 5,418,398 A | * | 5/1995 | Sardella et al. | ............. 257/755 |
| 5,441,904 A | | 8/1995 | Kim et al. | ..................... 437/40 |
| 5,514,621 A | | 5/1996 | Tabara | ......................... 437/186 |
| 5,604,157 A | | 2/1997 | Dai et al. | .................... 437/200 |
| 5,614,428 A | | 3/1997 | Kapoor | ......................... 437/41 |
| 5,652,156 A | * | 7/1997 | Liao et al. | ................... 257/413 |
| 5,712,181 A | * | 1/1998 | Byun et al. | .................... 437/46 |
| 5,843,829 A | * | 12/1998 | Kuramae et al. | ........... 438/396 |

FOREIGN PATENT DOCUMENTS

| | | | | |
|---|---|---|---|---|
| JP | 0295644 | | 12/1986 | |
| JP | 3-55850 | * | 3/1991 | ......... H01L/21/336 |
| JP | 6-196494 | * | 7/1994 | ......... H01L/21/336 |

\* cited by examiner

*Primary Examiner*—Ori Nadav
(74) *Attorney, Agent, or Firm*—Blakely, Sokoloff, Taylor & Zafman LLP

(57) ABSTRACT

A polysilicon/amorphous silicon composite layer for improved linewidth control in the patterning of gate electrodes, in the manufacture of metal oxide semiconductor (MOS) devices. The formation of a composite polysilicon/amorphous silicon gate in an integrated circuit gives the device the electrical performance and doping qualities of a polysilicon gate and also gives the device the smoothness of an amorphous silicon gate which improves line definition during gate patterning.

25 Claims, 5 Drawing Sheets

POLYSILICON/AMORPHOUS SILICON COMPOSITE GATE ELECTRODE

This is a divisional of application No. 08/536,525, filed Sep. 29, 1995, now abandoned.

BACKGROUND OF THE INVENTION

1. Field of the Invention

This invention relates to the field of semiconductor devices, and more specifically, to a process designed to improve the surface planarity of polysilicon gate layers.

2. Background Information

In order to fabricate high performance metal oxide semiconductor (MOS) transistors, it is crucial to control gate electrode linewidths. Improved control of the gate electrode linewidth allows the formation of smaller channel lengths and increases the performance of MOS transistors. Nonplanar polysilicon layer surfaces degrade the ability to control linewidths during lithographic processing for gate patterning. This degradation of control is generally due to variations in photoresist thickness and irregular light reflections off the polysilicon surface.

Polycrystalline silicon (polysilicon) is a preferred gate electrode material for MOS devices because it is easy to deposit and easy to dope. Polysilicon, however, due to its grain structure, forms a relatively rough surface layer. It is this rough surface layer of polysilicon that interferes with lithographic patterning and decreases linewidth control.

FIG. 1a illustrates a cross sectional view of polysilicon layer 130 deposited above thin gate oxide layer 120, isolation regions 110 & 111, and substrate 100. The rough surface of polysilicon layer 130 caused by the grain structure of polysilicon is also illustrated in FIG. 1a. The rough surface of polysilicon layer 130 causes reflection and scattering effects during photolithographic patterning of a photoresist.

FIG. 1b illustrates a cross sectional view of mask 150 and photoresist layer 140 coated on the polysilicon layer 130 of FIG. 1a. It is a well known process in the art to pattern polysilicon gate layers using a patterned photoresist. In order to pattern photoresist layer 140, mask 150 is used to block the light. As shown in FIG. 1b mask 150 only covers a portion of photoresist layer 140. The uncovered regions of photoresist layer 140 are exposed to light. Exposure to light causes the uncovered portions of photoresist layer 140 to become soluble. FIG. 1b illustrates mask 150 and photoresist layer 140 being exposed to light. Because the light rays are being reflected and scattered by the rough surface of polysilicon layer 130, regions of photoresist layer underlying the mask are exposed to light and become soluble. It should be noted and it will be obvious to one with ordinary skill in the art that although a positive photoresist process is described, a negative photoresist process may also be used.

After photoresist layer 140 has been subjected to a developing solution only the insoluble portions of photoresist layer 140 remain, as shown in FIG. 1c. The insoluble portions of photoresist layer are the portions of photoresist layer 140 not exposed to light. Due to the reflection and scattering of the light by polysilicon layer 130, photoresist layer 140 is poorly patterned. The features of photoresist layer 140 have poor edge definition and have varying horizontal dimensions.

The patterned photoresist is then used to pattern the polysilicon layer 130 into a gate electrode. Polysilicon gate layer 130 is patterned using well known etch techniques, such as, reactive ion etch (RIE), to form a polysilicon gate electrode as shown in FIG. 1d. Because the patterned photoresist layer 140 (in FIG. 1c) has wavy edges and varying horizontal dimensions, the gate electrode 130 in FIG. 1d is formed with poor edge definition and varying linewidth. Therefore, the poorly patterned photoresist layer can cause the gate electrode to be formed with varying gate-lengths. FIG. 1e illustrates a top view of the gate electrode 130 in FIG. 1d.

The variation in gate-length of the gate electrode can cause variations in channel length. Variation of the channel length varies the electrical characteristics of an MOS device and must be carefully controlled.

Presently there are several techniques for improving gate electrode linewidth control in the manufacture of high performance MOS transistors. The first technique is known as amorphous silicon deposition. Amorphous silicon deposition eliminates the surface roughness caused by the grain structure of polysilicon, however, a degradation in the electrical performance of the gate electrode is common in pure amorphous silicon gates. Additionally, amorphous silicon deposition has problems with deposition defects and is also more difficult to fully dope.

A second technique for improving linewidth control is the use of an amorphous silicon/polysilicon composite gate electrode. An amorphous silicon layer is deposited first and then a polysilicon layer is deposited on top of the amorphous silicon layer. However, such a composite layer may still exhibit surface roughness unless an intervening oxide layer is deposited or grown above the amorphous silicon layer. Because the amorphous silicon layer is deposited first, crystal growth will occur in the deposition of the top polysilicon layer. Unless an intervening oxide layer is used there is nothing to constrain the smooth surface of the amorphous silicon layer during the deposition of the polysilicon layer. In other words, recrystallization of the amorphous silicon layer cannot be controlled. Consequently, the amorphous silicon layer may recrystallize with a rough surface. Thus, the amorphous silicon/polysilicon composite gate may exhibit the surface roughness found in a pure polysilicon layer, and the poor electrical performance, deposition defects, and decreased dopant uniformity exhibited in pure amorphous silicon gates.

A third technique for improving linewidth control is the use of anti-reflective layers as part of the lithographic process. The use of anti-reflective layers reduces the effect of the surface roughness caused by the grain structure of polysilicon. An anti-reflective layer is highly absorbing and reduces the reflection and scattering effects caused by the rough surface of the polysilicon layer. Anti-reflective layers, however, require special processing equipment and add additional steps, i.e. depositing and etching the anti-reflective layer. The need for special processing equipment significantly increases the cost of manufacturing the MOS transistors. Also, the additional steps required by the use of anti-reflective layers increases the defect level normally associated with the production of MOS transistors.

Another technique for improving linewidth control is the use of dual layer resists when patterning a polysilicon gate electrode. In a dual layer resist a first planarizing resist layer is deposited and a second resist layer is spun on top of the first resist layer. The first resist layer may contain a die such that it exhibits many of the absorbing qualities of an anti-reflective coating. The second resist layer is generally a constant thickness to aid in the control of thin film interference effects. However, the use of the dual resist increases the cost of manufacturing the MOS transistors and, much like the antireflective coating, requires additional processing steps. Anytime additional processing steps are added increases the likelihood that the defect level normally associated with the production of MOS transistors will increase.

Thus, what is needed is a method for the formation of a gate electrode that combines the electrical performance of polysilicon with the surface planarity of amorphous silicon thereby improving linewidth control using standard lithographic techniques without increasing the defect level already associated with the manufactured of high performance MOS transistors.

SUMMARY OF THE INVENTION

The present invention describes a method for improved linewidth control in the patterning of polysilicon layers, which are used to form gate electrodes, in the manufacture of metal oxide semiconductor (MOS) devices. The preferred embodiment of the present invention forms a composite gate electrode by depositing a layer of polysilicon above a substrate and then depositing a layer of amorphous silicon above the polysilicon layer. The two layers are deposited in a single deposition step without breaking vacuum. An anneal step is performed to recrystallize the amorphous silicon layer. The two layers are then patterned and etched using generally known lithographic and etching techniques to form a composite gate electrode. The formation of a composite polysilicon/amorphous silicon gate in an integrated circuit gives the device the electrical performance and doping qualities of a polysilicon gate and also gives the device the smoothness of an amorphous silicon gate which improves line definition during gate patterning.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which:

FIG. 2b illustrates a cross sectional view of a gate oxide layer formed above the substrate of FIG. 2a.

DETAILED DESCRIPTION

A polysilicon/amorphous silicon gate electrode is disclosed. In the following description, numerous specific details are set forth such as specific materials, equipment, process patterns, thicknesses, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention describes a process for improving linewidth control in the manufacture of high performance metal oxide semiconductor (MOS) transistors. In the manufacture of high performance MOS transistors and more specifically when using silicon to form a gate electrode, the present invention is employed to eliminate the roughness in the surface of the silicon layer without degrading electrical performance of the device. The elimination of the surface roughness of the silicon layer used to form the gate electrode improves linewidth control during the lithographic patterning of a photoresist. Improved linewidth control in patterning the photoresist helps to control the formation and patterning of gate electrodes and other subsequent processing layers. Improved control over the patterning of gate electrodes allows the formation of smaller channel lengths and increases the performance of MOS transistors.

It is to be noted that the term "substrate" is used throughout the present disclosure. Substrate is used to refer to a semiconductor substrate or a part thereof, such as, silicon, silicon on insulator, gallium arsenide, etc. The term substrate includes, but is not limited to: fully processed, semi-processed, or unprocessed substrates with semiconductor materials thereon.

Figure 1A:
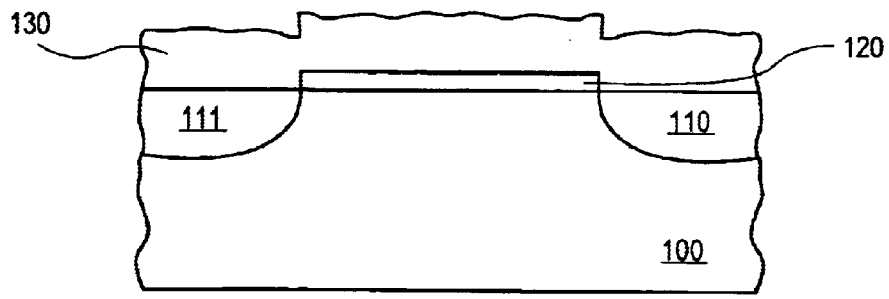
FIG. 1a illustrates a cross sectional view of a polysilicon layer deposited above a gate oxide layer, isolation regions, and substrate.
Figure 1B:
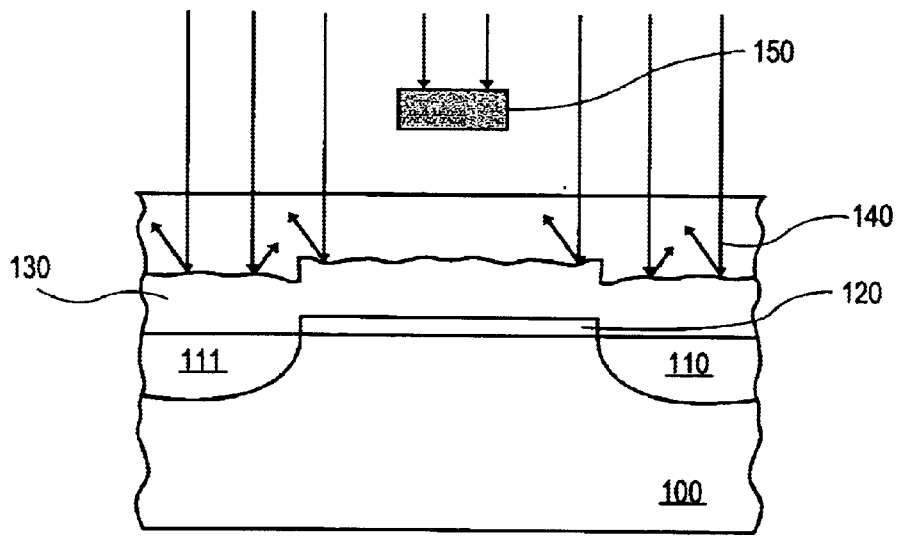
FIG. 1b illustrates a cross sectional view of a mask and a photoresist layer coated on the polysilicon layer of FIG. 1a during exposure to light.
Figure 1C:
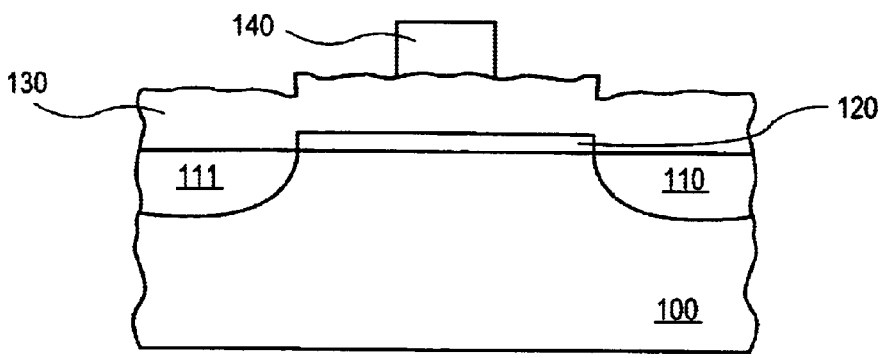
FIG. 1c illustrates a cross sectional view of the photoresist layer of FIG. 1b after patterning.
Figure 1D:
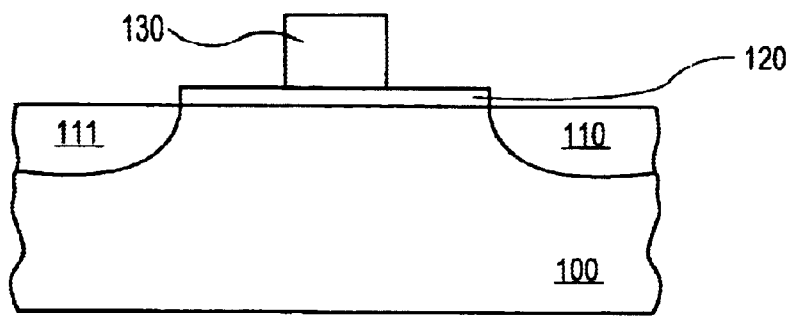
FIG. 1d illustrates a cross sectional view of the photoresist layer of FIG. 1c after patterning into a gate electrode.
Figure 1E:
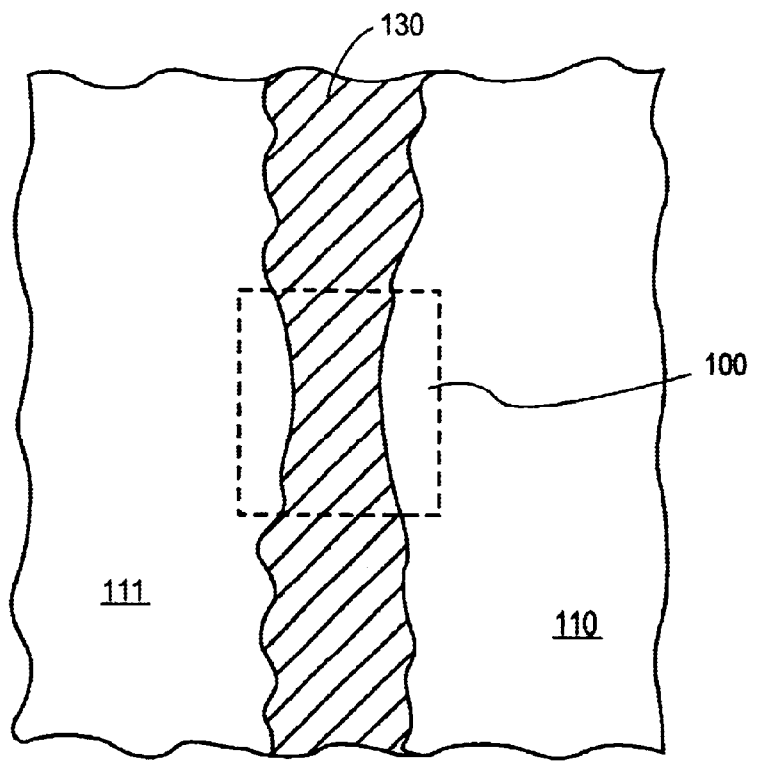
FIG. 1e illustrates a top view of the gate electrode 130 in FIG. 1d.
Figure 2A:
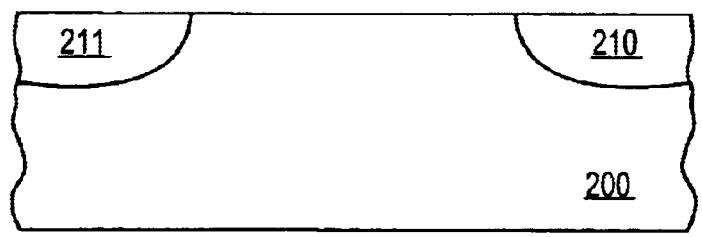
FIG. 2a illustrates a cross sectional view of isolation regions formed in a substrate.

The general processing steps used in the manufacture of a MOS transistor are well known in the art and will be obvious to one with skill in the art, therefore, these steps are not described in detail. FIG. 2a illustrates field oxide regions (isolation structures) 210 and 211 formed in substrate 200. In a currently preferred embodiment the field oxide regions 210 and 211 are formed by shallow trench isolation, however, it should be noted that they may also be formed by other methods, such as, LOCOS isolation.

Figure 2B:
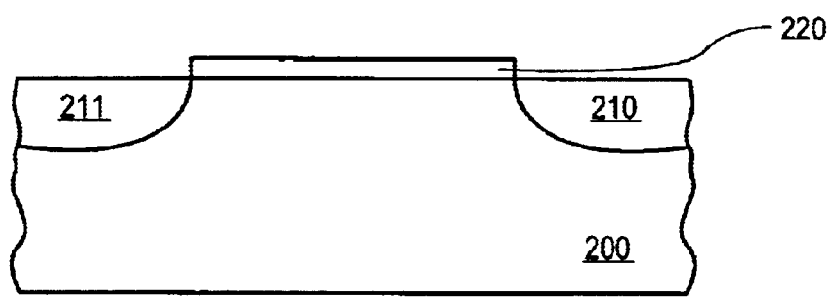

FIG. 2b illustrates a thin gate oxide layer 220 formed on substrate 200. It should be noted that the thin gate oxide layer referred to in the description of the present invention is also known in the art as a gate dielectric layer. In a currently preferred embodiment the thin gate oxide comprises $SiO_2$.

Figure 2C:
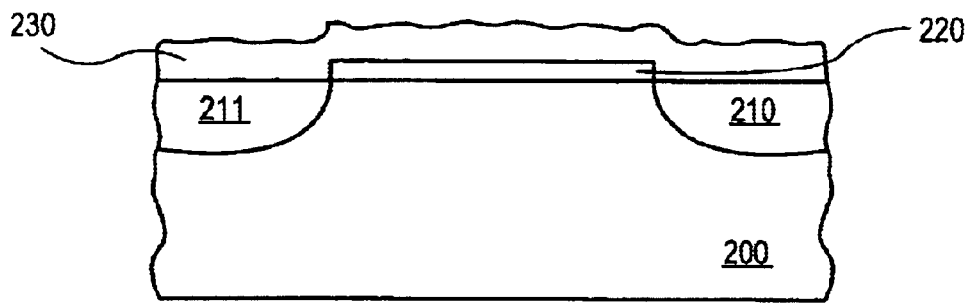
FIG. 2c illustrates a cross sectional view of a polysilicon layer deposited above the oxide layer of FIG. 2b.

After the thin gate oxide is formed a first silicon layer is deposited. A preferred embodiment of the present invention utilizes a polycrystalline silicon (polysilicon) layer. FIG. 2c illustrates a polysilicon layer 230 deposited above thin gate layer 220. Polysilicon layer 230 may be deposited at a temperature in the range of approximately 600–700° C. and at a pressure in the range of approximately 1 pascal to approximately 1 atmosphere. In one currently preferred embodiment the polysilicon layer is deposited at a temperature of approximately 620° C. and a pressure of approximately 15 pascal.

Polysilicon layer 230 may have a thickness in the range of approximately 200–2000 Å. It should be noted that the thicker the polysilicon layer the greater the surface roughness on the top of the polysilicon layer. Because it is desirable to control the surface roughness of the polysilicon layer as much as possible, it is desirable to use thinner layers of polysilicon as the seed layer for a composite gate. In one currently preferred embodiment the polysilicon layer is deposited to a thickness in the range of approximately 500–1000 Å.

The rough surface of polysilicon layer 230 caused by the grain structure of polysilicon is illustrated in FIG. 2c. The rough surface of polysilicon layer 230 causes reflection and scattering effects which degrade linewidth control during subsequent photolithographic patterning of a photoresist layer. In other words, the photoresist is poorly patterned.

Figure 2D:
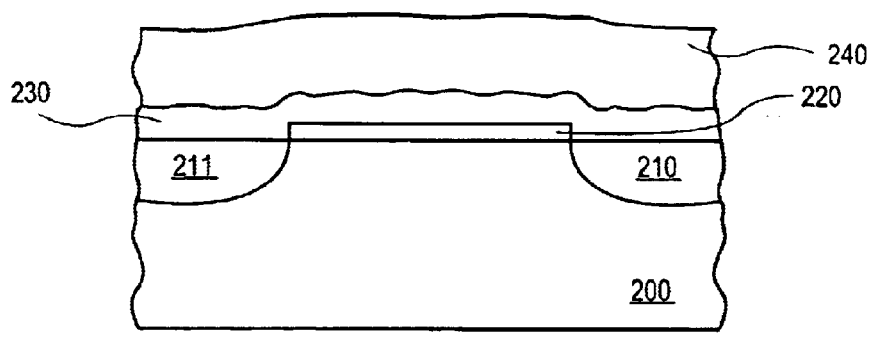
FIG. 2d illustrates a cross sectional view of an amorphous silicon layer deposited above the polysilicon layer of FIG. 2c.

In order to improve the control the linewidth in lithographic patterning and allow doping with conventional source/drain technology, for example, ion implantation, predep diffusion, etc., the gate electrode is formed with a second silicon layer deposited above the first polysilicon layer. A preferred embodiment of the present invention utilizes an amorphous silicon layer. FIG. 2d illustrates amorphous silicon layer 240 deposited above polysilicon layer 230. Amorphous silicon layer 240 may be deposited at a temperature in the range of approximately 500–600° C. and at a pressure in the range of approximately 1 pascal to approximately 1 atmosphere. In one currently preferred embodiment the amorphous silicon layer is deposited at a temperature of approximately 550° C. and a pressure of approximately 50 pascal.

Amorphous silicon layer 240 may have a thickness in the range of approximately 1800–3000 Å, such that the total combined thickness of the composite gate is in the range of approximately 2000–5000 Å. In one currently preferred embodiment the amorphous silicon layer is deposited to a thickness in the range of approximately 2500–3000 Å and the total thickness of the composite gate is approximately 3500 Å.

It should be noted that in one currently preferred embodiment the first polysilicon layer and the second amorphous silicon layer are deposited in a single deposition without breaking vacuum in a hot wall furnace. It will be obvious to one with ordinary skill in the art that it may be possible to break vacuum between the deposition of the two layers, however, doing so may cause a an oxide layer to form, in between the polysilicon and amorphous silicon layers, that may be desirable in the formation of a gate electrode. Additionally, it will be obvious to one with skill in the art that the deposition may be performed in a system other than a hot wall furnace, for example, a plasma reactor or a cold wall furnace.

After the amorphous silicon layer is deposited, any further processing that occurs above 600° C. will cause recrystallization to occur. In order to maintain the smooth surface of amorphous silicon layer 240, an oxide layer 245 is formed before recrystallization occurs. The oxide layer constrains the crystal growth of the amorphous silicon layer, such that the smooth surface of the amorphous silicon layer is maintained. In one currently preferred embodiment, a native oxide 245 is grown above amorphous silicon layer 240 at a temperature of less than 600° C. It will be obvious to one with ordinary skill in the art that an oxide layer may be deposited rather than grown above the amorphous silicon layer. Once the oxide layer is formed, it may be desirable to perform an anneal before any further processing.

The purpose for using an amorphous silicon layer is that amorphous silicon has a smooth/planar surface. It is therefore important that recrystallization (i.e. the anneal) is performed properly to maintain that smooth surface quality. The anneal may be performed in a Rapid Thermal Processing (RTP) System or a diffusion/conventional furnace at a temperature in the range of approximately 700–900° C. for a duration of from approximately 2 seconds to approximately 2 hours. It should be noted that while anneals performed for longer durations promote crystal growth (i.e. recrystallization) they may result in crystal growth with grown boundary geometries and crystal orientations which may degrade the electrical performance of the gate electrode. In one currently preferred embodiment the anneal is performed in an RTP in a nitrogen ambient at a temperature of approximately 750° C. for a duration of approximately 30 seconds. It should be noted and it will be obvious to one with ordinary skill in the art that ambients other than nitrogen may also be used, for example, argon, nitrogen with oxygen, hydrogen gas ($H_2$), and oxidizing ambients.

After amorphous silicon layer 240 has been recrystallized then the polysilicon/amorphous silicon composite layer is patterned using a conventional positive photoresist. It will be obvious to one with ordinary skill in the art that other photoresists may also be used, for example, negative photoresist. The photoresist is used to pattern the polysilicon/amorphous silicon layer into a gate electrode. A poorly patterned photoresist feature causes the formation of non-uniform gate electrodes. Non-uniform gate electrode linewidth, in turn, causes non-uniform transistor channel lengths and prevents the formation of small channel lengths, thus causing a decrease in device performance. It is therefore advantageous to recrystallize the amorphous silicon layer with as little surface roughness as possible.

Decreasing the surface roughness of the polysilicon/amorphous silicon composite layer reduces reflection and scattering effects during photolithography and provides a constant resist thickness across a printed field improving the patterning of the photoresist layer. Since the photoresist is used to pattern the gate electrode, the improved photoresist pattern definition permits uniform formation of the gate electrode. Uniform gate electrode linewidth permits more uniform transistor channel length and allows the formation of smaller channel lengths which ultimately increase device performance.

Figure 2E:
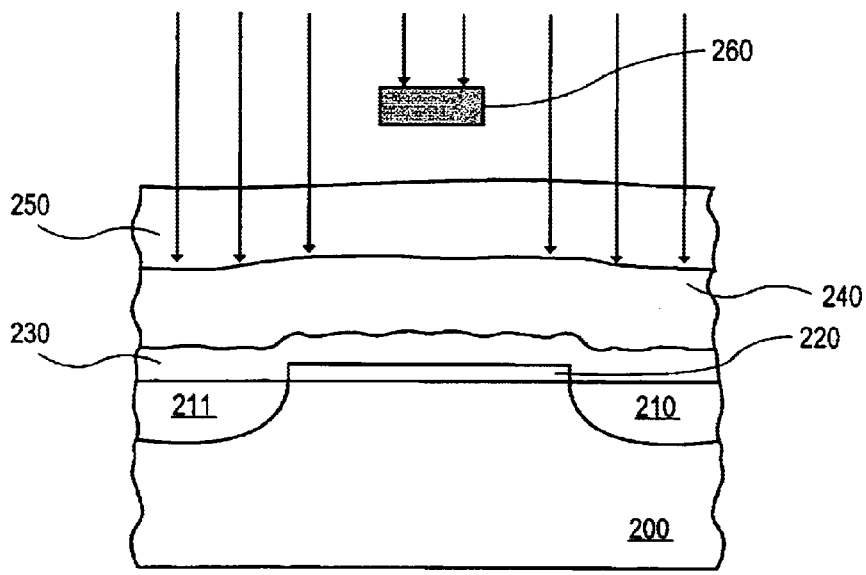
FIG. 2e illustrates a cross sectional view of a mask and a photoresist layer coated on the polysilicon/amorphous silicon layer of FIG. 2c during exposure to light.

The polysilicon/amorphous silicon composite layer is then patterned into a gate electrode using a patterned photoresist. First, a photoresist layer 250 is coated onto the oxide layer 245 as illustrated in FIG. 2e. In order to pattern photoresist layer 250, mask 260 is used. As shown in FIG. 2e mask 260 only covers a portion photoreist layer 250. The uncovered regions of photoresist layer 250 are exposed to light. Exposure to light causes the uncovered portions of photoresist layer 250 to become soluble. FIG. 2e illustrates the exposure of mask 260 and photoresist layer 250 to light. Since the polysilicon/amorphous silicon composite layer has a relatively smooth surface the light rays are not being reflected and scattered, thus only the exposed regions of photoresist layer 250 becomes soluble. The smooth surface of the polysilicon/amorphous silicon composite layer also ensures a uniform photoresist thickness and no variation in light intensity in the photoresist due to internal reflection and interference.

Figure 2F:
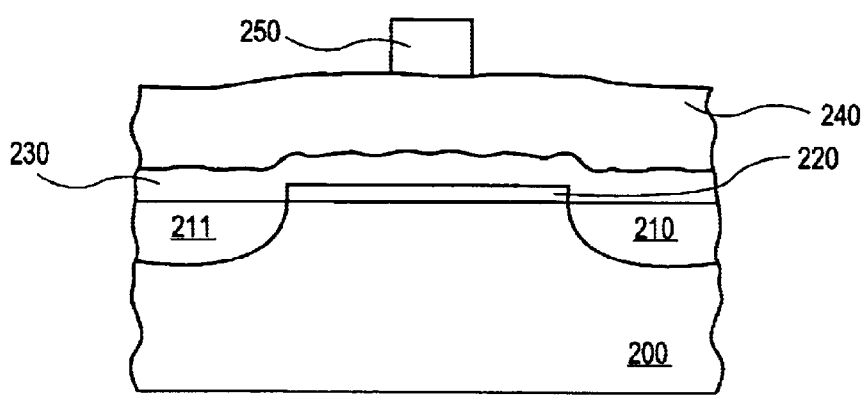
FIG. 2f illustrates a cross sectional view of the photoresist layer of FIG. 2e after patterning.

After photoresist layer 250 has been subjected to a developing solution only the insoluble portions of photoresist layer 250 remain, as illustrated in FIG. 2f. The insoluble portions of photoresist layer are the portions of photoresist layer 250 not exposed to light. Since the light was not reflected or scattered by the polysilicon/amorphous silicon composite layer and since the photoresist has a locally uniform thickness, photoresist layer 250 is properly patterned and has good definition. The patterned photoresist layer 250 has straight lines and uniform width.

Figure 2G:
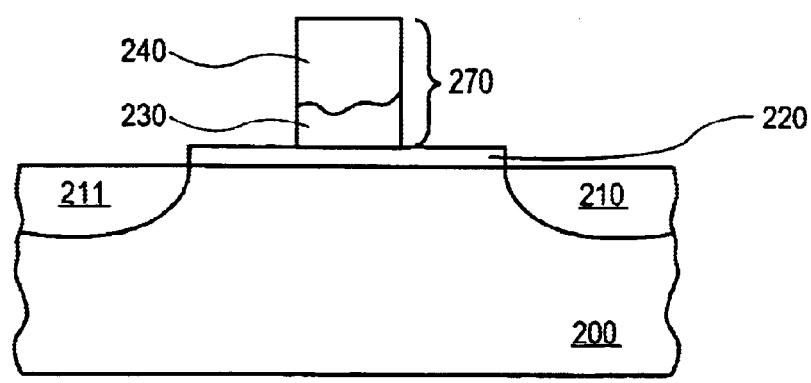
FIG. 2g illustrates a cross sectional view of the polysilicon/amorphous silicon layer of FIG. 2f after patterning into a gate electrode.
Figure 2H:
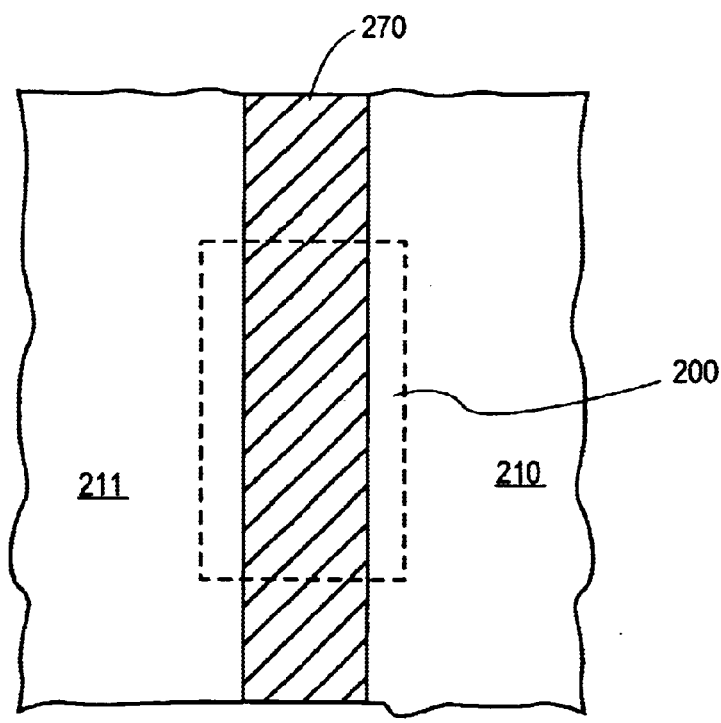
FIG. 2h illustrates a top view of gate electrode 260 in FIG. 2g.

The patterned photoresist is then used to pattern the polysilicon/amorphous silicon composite layer into a gate electrode. The polysilicon/amorphous silicon composite layer is patterned using well known etch techniques, such as, reactive ion etch (RIE), to form a polysilicon/amorphous silicon composite gate electrode 270 as illustrate in FIG. 2g. Because patterned photoresist layer 250 (in FIG. 2f) had straight edges and uniform width, the gate electrode 270 in FIG. 2g is formed with straight edges and a uniform gate length. FIG. 2h illustrates a top view of gate electrode 270 in FIG. 2g.

The present invention permits the formation of gate electrode 270 with straight edges and well-defined linewidth. The polysilicon/amorphous silicon composite layer allows the gate-length dimensions to be precisely maintained during patterning of the gate electrode. Maintaining the gate length is important because the channel length of an MOS device depends upon the gate length, thus, the smaller the gate length the smaller the channel length. The length of the gate and the channel length have a great impact on the electrical characteristics of an MOS device.

The above described polysilicon/amorphous silicon composite layer provides a smooth surface for uniform gate patterning without the use of expensive anti-reflective coatings (ARCs). The smooth surface of the polysilicon/amorphous silicon composite layer is advantageous for tighter linewidth and improved critical dimension control during lithographic patterning of a photoresist and for gate patterning improvement. The polysilicon seed (bottom) layer of the polysilicon/amorphous silicon composite gate electrode furnishes the composite gate with the electrical performance and dopant integrity of a conventional pure polysilicon gate electrode. The amorphous silicon top layer of the polysilicon/amorphous silicon composite gate electrode furnishes the composite gate with the smoothness and surface planarity of a pure amorphous silicon gate. Additionally, it is the composite nature/makeup of the polysilicon/amorphous silicon composite gate electrode of the present invention which helps to overcome the polysilicon depletion effect.

Thus, a polysilicon/amorphous silicon gate electrode has been described. Although specific embodiments, including specific equipment, process parameters, thicknesses, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. An integrated circuit comprising:
   a substrate region;
   a source region located within said substrate region;
   a drain region located within said substrate region;
   an oxide layer located above said substrate region; and
   a gate electrode located above said oxide layer, said gate electrode consisting of a lower polysilicon layer, and an upper recrystallized amorphous silicon layer, the lower polysilicon layer being thinner than the upper recrystallized amorphous silicon layer to substantially control a surface roughness of the lower polysilicon layer the upper recrystallized amorphous silicon layer constrained so as to substantially maintain a substantially smooth top surface.

2. The integrated circuit as described in claim 1 wherein said lower polysilicon layer is deposited to a first thickness of approximately 200–2000 Å.

3. The integrated circuit as described in claim 1 wherein said upper recrystallized amorphous silicon layer is deposited to a second thickness of approximately 1800–3000 Å.

4. The integrated circuit as described in claim 1 wherein said gate electrode is formed by depositing said lower polysilicon layer at a first temperature of in the range of approximately 600 to 700° C. and at a first pressure in the range of approximately 1 pascal to approximately 1 atmosphere.

5. The integrated circuit as described in claim 1 wherein said gate electrode is formed by depositing an amorphous layer at a second temperature in the range of approximately 500 to 600° C. and at a second pressure in the range of approximately 1 pascal to approximately 1 atmosphere.

6. The integrated circuit as described in claim 1, wherein said upper recrystallized amorphous silicon layer is annealed at a third temperature in the range of approximately 700° to 900° C. for a duration of from approximately 2 seconds to approximately 2 hours.

7. The integrated circuit as described in claim 1 further comprising a second oxide layer formed above the upper recrystallized amorphous silicon layer.

8. The integrated circuit of claim 7 where said second oxide layer is substantially the same width as said upper recrystallized amorphous silicon layer.

9. The integrated circuit of claim 1 where said upper recrystallized amorphous silicon layer is deposited to a second thickness sufficient to result in a substantially smooth top surface.

10. A composite gate electrode consisting of:
    a lower polysilicon layer; and
    an upper recrystallized amorphous silicon layer on the lower polysilicon layer, the lower polysilicon layer being thinner than the upper recrystallized amorphous silicon layer to substantially control a surface roughness of the lower polysilicon layer upper recrystallized amorphous silicon layer constrained so as to substantially maintain a substantially smooth top surface.

11. The composite gate electrode as described in claim 10 wherein said lower polysilicon layer is deposited to a first thickness of approximately 200–2000 Å.

12. The composite gate electrode as described in claim 10 wherein said upper recrystallized amorphous silicon layer is deposited to a second thickness of approximately 1800–3000 Å.

13. The composite gate electrode as described in claim 10 wherein said lower polysilicon layer is deposited at a first temperature of in the range of approximately 600 to 700° C. and at a first pressure in the range of approximately 1 pascal to approximately 1 atmosphere.

14. The integrated circuit as described in claim 10 wherein said upper recrystallized amorphous silicon layer is deposited at a second temperature in the range of approximately 500 to 600° C. and at a second pressure in the range of approximately 1 pascal to approximately 1 atmosphere.

15. The composite gate electrode as described in claim 10, wherein said upper recrystallized amorphous silicon layer is annealed at a third temperature in the range of approximately 700° to 900° C. for a duration of from approximately 2 seconds to approximately 2 hours.

16. An integrated circuit comprising:
a substrate region;
a source region located within said substrate region;
a drain region located within said substrate region;
an oxide layer located above said substrate region;
a composite gate electrode, wherein said composite gate electrode consists of a lower polysilicon layer and an upper recrystallized amorphous silicon layer, said upper recrystallized amorphous silicon layer being located above said lower polysilicon layer, the lower polysilicon layer being thinner than the upper recrystallized amorphous silicon layer to substantially control a surface roughness of the polysilicon layer; and
a second oxide layer, located above said upper recrystallized amorphous silicon layer, such that said second oxide layer constrains the crystal growth of said upper recrystallized amorphous layer, substantially maintaining a substantially smooth surface of the upper recrystallized amorphous silicon layer.

17. The integrated circuit as described in claim 16 wherein said lower polysilicon layer is deposited to a first thickness of approximately 200–2000 Å.

18. The integrated circuit as described in claim 16 wherein said upper recrystallized amorphous silicon layer is deposited to a second thickness of approximately 1800–3000 Å.

19. The integrated circuit as described in claim 16 wherein said gate electrode is formed by depositing said lower polysilicon layer at a first temperature of in the range of approximately 600 to 700° C. and at a first pressure in the range of approximately 1 pascal to approximately 1 atmosphere.

20. The integrated circuit as described in claim 16 wherein said gate electrode is formed by depositing an amorphous silicon layer at a second temperature in the range of approximately 500 to 600° C. and at a second pressure in the range of approximately 1 pascal to approximately 1 atmosphere.

21. The integrated circuit as described in claim 16, wherein said upper recrystallized amorphous silicon layer is annealed at a third temperature in the range of approximately 700° to 900° C. for a duration of from approximately 2 seconds to approximately 2 hours.

22. The integrated circuit of claim 16 where said second oxide layer is substantially the same width as said upper recrystallized amorphous silicon layer.

23. A composite gate electrode consisting of:
a lower polysilicon layer;
an upper recrystallized amorphous silicon layer formed on the lower polysilicon layer, the lower polysilicon layer being thinner than the upper recrystallized amorphous silicon layer to substantially control a surface roughness of the lower polysilicon layer, and wherein no oxide exists between the polysilicon layer and the recrystallized amorphous silicon layer; and
an oxide layer formed above the upper recrystallized amorphous silicon layer, such that the oxide layer constrains the crystal growth of said upper recrystallized amorphous silicon layer, substantially maintaining a substantially smooth surface of the upper recrystallized amorphous silicon layer.

24. The integrated circuit as described in claim 23, wherein said upper recrystallized amorphous silicon layer is annealed at a temperature in the range of approximately 700° to 900° C. for a duration of from approximately 2 seconds to approximately 2 hours.

25. The composite gate electrode of claim 23 where said oxide layer is substantially the same width as said upper recrystallized amorphous silicon layer.

* * * * *